US010347837B2

(12) United States Patent
Xin et al.

(10) Patent No.: US 10,347,837 B2
(45) Date of Patent: Jul. 9, 2019

(54) ORGANIC ELECTROLUMINESCENT DISPLAY PANEL, METHOD FOR MANUFACTURING THE SAME, AND DISPLAY DEVICE

(71) Applicant: SHANGHAI TIANMA AM-OLED CO., LTD., Shanghai (CN)

(72) Inventors: Yu Xin, Shanghai (CN); Yuan Li, Shanghai (CN); Naichao Mu, Shanghai (CN); Lijing Han, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/983,092

(22) Filed: May 18, 2018

(65) Prior Publication Data
US 2018/0269397 A1 Sep. 20, 2018

(30) Foreign Application Priority Data
Nov. 7, 2017 (CN) .......................... 2017 1 1084837

(51) Int. Cl.
| H01L 51/00 | (2006.01) |
| C23C 14/24 | (2006.01) |
| H01L 51/56 | (2006.01) |
| C23C 14/04 | (2006.01) |
| H01L 27/32 | (2006.01) |

(52) U.S. Cl.
CPC ........ *H01L 51/0011* (2013.01); *C23C 14/042* (2013.01); *C23C 14/24* (2013.01); *H01L 27/3216* (2013.01); *H01L 27/3223* (2013.01); *H01L 51/001* (2013.01); *H01L 51/56* (2013.01); *H01L 27/3244* (2013.01)

(58) Field of Classification Search
CPC ............. H01L 51/0011; H01L 27/3216; H01L 27/3223; H01L 51/001; H01L 51/56; H01L 27/3244; C23C 14/042; C23C 14/24
See application file for complete search history.

(56) References Cited

U.S. PATENT DOCUMENTS

2015/0372067 A1* 12/2015 Kim .................... H01L 27/3246
257/40

* cited by examiner

*Primary Examiner* — Victor A Mandala
*Assistant Examiner* — Colleen E Snow
(74) *Attorney, Agent, or Firm* — Kilpatrick Townsend & Stockton LLP

(57) ABSTRACT

The disclosure discloses an organic electroluminescent display panel, a method for manufacturing the same, and a display device, where organic light-emitting layers of display sub-pixels and virtual sub-pixels may be created on an underlying substrate through evaporation using a fine metal mask and a shielding mask arranged in a stack, and the area of the organic light-emitting layer of a non-rectangular shaped virtual sub-pixel among the virtual sub-pixels is smaller than the area of the organic light-emitting layer of a display sub-pixel capable of emitting light in the same color.

24 Claims, 11 Drawing Sheets

ORGANIC ELECTROLUMINESCENT DISPLAY PANEL, METHOD FOR MANUFACTURING THE SAME, AND DISPLAY DEVICE

This application claims the benefit of Chinese Patent Application No. CN 201711084837.9, filed with the Chinese Patent Office on Nov. 7, 2017, which is hereby incorporated by reference in its entirety.

FIELD

The present disclosure relates to the field of display technologies, and particularly to an organic electroluminescent display panel, a method for manufacturing the same, and a display device.

BACKGROUND

At present, screens of common display devices, e.g., monitors, TV sets, mobile phones, tablet computers, etc., are typically regular rectangles. As the display technologies are advancing, an all-screen display panel with a higher proportion of the screen to the panel, an ultra-narrow edge frame, etc., can significantly improve a visual effect for a watcher as compared with a general display panel, and thus has been widely favored. At present, in a display device with an all-screen, e.g., a mobile phone, etc., in order to enable the functions of self-photographing, visible communication, and fingerprint recognition, a front camera, an earphone, a fingerprint recognition area or physical button, etc., are typically arranged on the front of the display device. FIG. 1 illustrates a schematic structural diagram of a display panel, where a front camera 10, an earphone 20, etc., are typically arranged in the uppermost non-display area of the display panel, and a fingerprint recognition area or physical button 30, etc., is typically arranged on the lowermost non-display area of the display panel, so that there is a notch 40 in a display area of the display panel; and in order to accommodate the tactility of the display area for a user, varying arc angles (R angles) 50 are arranged at four corners of the display area, so that the shape of the display area is other than a rectangle (the display area is non-rectangular shaped).

In order to display throughout the screen, a Fine Metal Mask (FMM) of an organic light-emitting layer in the non-rectangular shaped display area needs to be fabricated in the same shape as the non-rectangular shaped display area as illustrated in FIG. 2. The design of the non-rectangular shaped fine metal mask prolongs the design, simulation, and fabrication of the fine metal mask, but also poses a great challenge to the design of mask and evaporation processes. For example, there is poor planarity of the non-rectangular shaped fine metal mask at the notch after it is designed, thus discouraging the extent of fitting in the evaporation process, and degrading the precision of an evaporation pattern, which may lower a good yield ratio.

Accordingly it may be difficult to fabricate the organic light-emitting layer in the non-rectangular shaped display area using the existing FMM fabrication process, and the existing design of the non-rectangular shaped display product.

SUMMARY

Embodiments of the disclosure provide an organic electroluminescent display panel, a method for manufacturing the same, and a display device so as to address the problem in the prior art of the difficulty with fabricating an organic light-emitting layer in a non-rectangular shaped display area.

An embodiment of the disclosure provides an organic electroluminescent display including:

an underlying substrate; and a non-rectangular shaped pixel area located on the underlying substrate, the non-rectangular shaped pixel area including a display area, and a virtual pixel area located on a periphery of the display area, wherein the display area comprises display sub-pixels, and the virtual pixel area comprises virtual sub-pixels, wherein:

both the display sub-pixels and the virtual sub-pixels include organic light-emitting layers, and while the organic electroluminescent display panel is displaying, the virtual sub-pixels are in a dark state; and there is at least one non-rectangular shaped virtual sub-pixel among the virtual sub-pixels, and an area of the organic light-emitting layer in the non-rectangular shaped virtual sub-pixel is smaller than an area of the organic light-emitting layer in a display sub-pixel capable of emitting light in a same color.

In a possible implementation, in the organic electroluminescent display above according to the embodiment of the disclosure, a shape of the organic light-emitting layer in the non-rectangular shaped virtual sub-pixel is different from a shape of the organic light-emitting layer in the display sub-pixel capable of emitting light in the same color.

In a possible implementation, in the organic electroluminescent display above according to the embodiment of the disclosure, the number of sides of the organic light-emitting layer of the at least one non-rectangular shaped virtual sub-pixel is more than or less than the number of sides of the organic light-emitting layer of the display sub-pixel capable of emitting light in the same color.

In a possible implementation, in the organic electroluminescent display above according to the embodiment of the disclosure, the organic light-emitting layer of the at least one non-rectangular shaped virtual sub-pixel includes an arc-shaped side.

In a possible implementation, in the organic electroluminescent display above according to the embodiment of the disclosure, the area of the organic light-emitting layer of the at least one non-rectangular shaped virtual sub-pixel is smaller than a half of the area of the organic light-emitting layer of a display sub-pixel capable of emitting light in the same color.

In a possible implementation, in the organic electroluminescent display above according to the embodiment of the disclosure, the area of the organic light-emitting layer of the at least one non-rectangular shaped virtual sub-pixel is larger than a half of the area of the organic light-emitting layer of a display sub-pixel capable of emitting light in the same color.

In a possible implementation, in the organic electroluminescent display above according to the embodiment of the disclosure, the non-rectangular shaped virtual sub-pixel is arranged on a periphery of the virtual pixel area.

In a possible implementation, in the organic electroluminescent display above according to the embodiment of the disclosure, there are n rows of virtual sub-pixels in the virtual pixel area in a direction from the display area to the virtual pixel area, wherein n is more than or equal to 1.

In a possible implementation, in the organic electroluminescent display above according to the embodiment of the disclosure, the number of rows of virtual sub-pixels in the virtual pixel area is more than or equal to 2, and less than or equal to 5.

In a possible implementation, in the organic electroluminescent display above according to the embodiment of the disclosure, there are equal areas of the organic light-emitting layers of the display sub-pixels capable of emitting in the same color in the display area.

In a possible implementation, in the organic electroluminescent display above according to the embodiment of the disclosure, there are different areas of the organic light-emitting layers of at least two of the non-rectangular shaped virtual sub-pixels capable of emitting light in a same color in the virtual pixel area.

In a possible implementation, in the organic electroluminescent display above according to the embodiment of the disclosure, there are different shapes of the organic light-emitting layers of at least two of the non-rectangular shaped virtual sub-pixels capable of emitting light in a same color in the virtual pixel area.

In a possible implementation, in the organic electroluminescent display above according to the embodiment of the disclosure, the display sub-pixels include pixel circuits located between the organic light-emitting layers and the underlying substrate.

In a possible implementation, in the organic electroluminescent display above according to the embodiment of the disclosure, the display sub-pixels include anodes located between the organic light-emitting layers and the underlying substrate.

In a possible implementation, in the organic electroluminescent display above according to the embodiment of the disclosure, the display sub-pixels and the virtual sub-pixels are arranged uniformly in an array.

In a possible implementation, in the organic electroluminescent display above according to the embodiment of the disclosure, the display sub-pixels and the virtual sub-pixels are arranged uniformly in a circle.

In a possible implementation, in the organic electroluminescent display above according to the embodiment of the disclosure, there is at least one non-right-angle corner in the non-rectangular shaped pixel area.

In a possible implementation, in the organic electroluminescent display above according to the embodiment of the disclosure, there is a notch on at least one side of the non-rectangular shaped pixel area.

In a possible implementation, in the organic electroluminescent display above according to the embodiment of the disclosure, a part of contour of an edge of the notch is an arc.

In another aspect, an embodiment of the disclosure further provides a display device including the organic electroluminescent display above according to the embodiment of the disclosure.

In another aspect, an embodiment of the disclosure further provides a method for manufacturing an organic electroluminescent display, the method including:

creating organic light-emitting layers of display sub-elements and virtual sub-elements on an underlying substrate through evaporation using a fine metal mask and a shielding mask arranged in a stack, wherein:

the shielding mask is located on a side of the fine metal mask facing the underlying substrate; and the fine metal mask includes at least one rectangular evaporation area in which there are a plurality of uniformly arranged evaporation patterns, and the shielding mask includes at least one non-rectangular shaped opening area, wherein:

a positive projection of each rectangular evaporation area onto the shielding mask cover one non-rectangular shaped opening area.

In a possible implementation, in the manufacturing method above according to the embodiment of the disclosure, there are a plurality of complete evaporation patterns of the respective rectangular evaporation areas in the non-rectangular shaped opening areas.

In a possible implementation, in the manufacturing method above according to the embodiment of the disclosure, there are parts of the evaporation patterns in the respective rectangular evaporation areas on the peripheries of the non-rectangular shaped opening areas.

In a possible implementation, in the manufacturing method above according to the embodiment of the disclosure, the areas of the rectangular evaporation-plating areas are larger than the areas of the non-rectangular shaped opening areas.

DETAILED DESCRIPTION OF THE EMBODIMENTS

Figure 1:
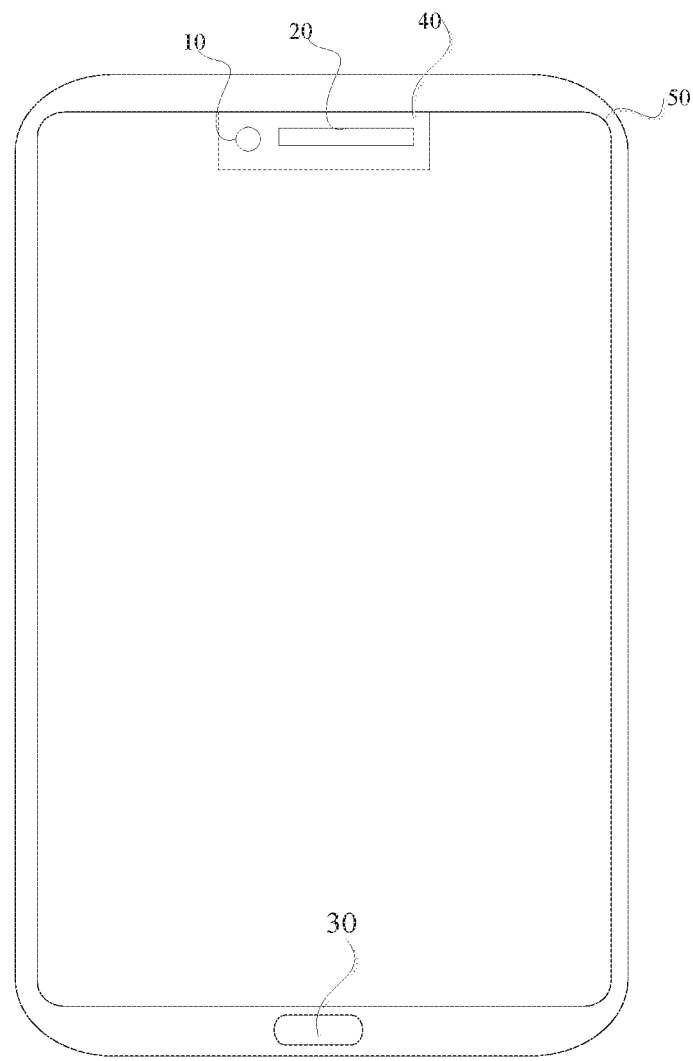
FIG. 1 is a schematic structural diagram of a display panel in the prior art.
Figure 2:
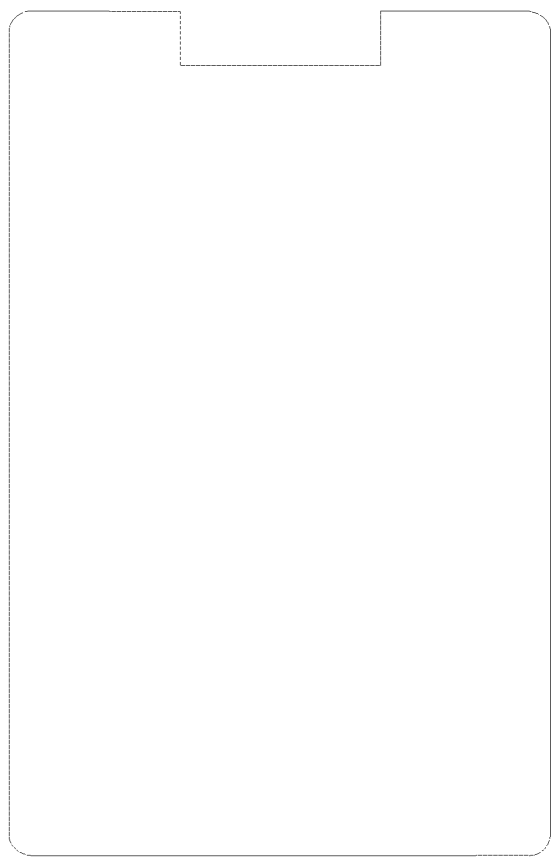
FIG. 2 is a schematic structural diagram of a fine metal mask in the prior art.

In view of the problem in the prior art of the difficulty with fabricating an organic light-emitting layer in a non-rectangular shaped display area, the embodiments of the disclosure provide an organic electroluminescent display panel, a method for manufacturing the same, and a display device. In order to make the objects, technical solutions, and advantages of the disclosure more apparent, specific implementations of the organic electroluminescent display panel, the method for manufacturing the same, and the display device according to the embodiments of the disclosure will be described below in details with reference to the drawings. It shall be appreciated that the embodiments to be described below are merely intended to illustrate and describe the disclosure, but not to limit the disclosure thereto. Moreover the embodiments of the disclosure, and the features in the embodiments may be combined with each other unless they conflict with each other.

The shapes and sizes of respective components in the drawings are not intended to reflect any real proportion, but merely intended to illustrate the disclosure of the disclosure.

For the sake of a convenient description, firstly a method for manufacturing an organic electroluminescent display panel according to an embodiment of the disclosure will be described in details in a particular implementation thereof.

A method for manufacturing an organic electroluminescent display panel according to an embodiment of the disclosure includes the operations.

Figure 3:
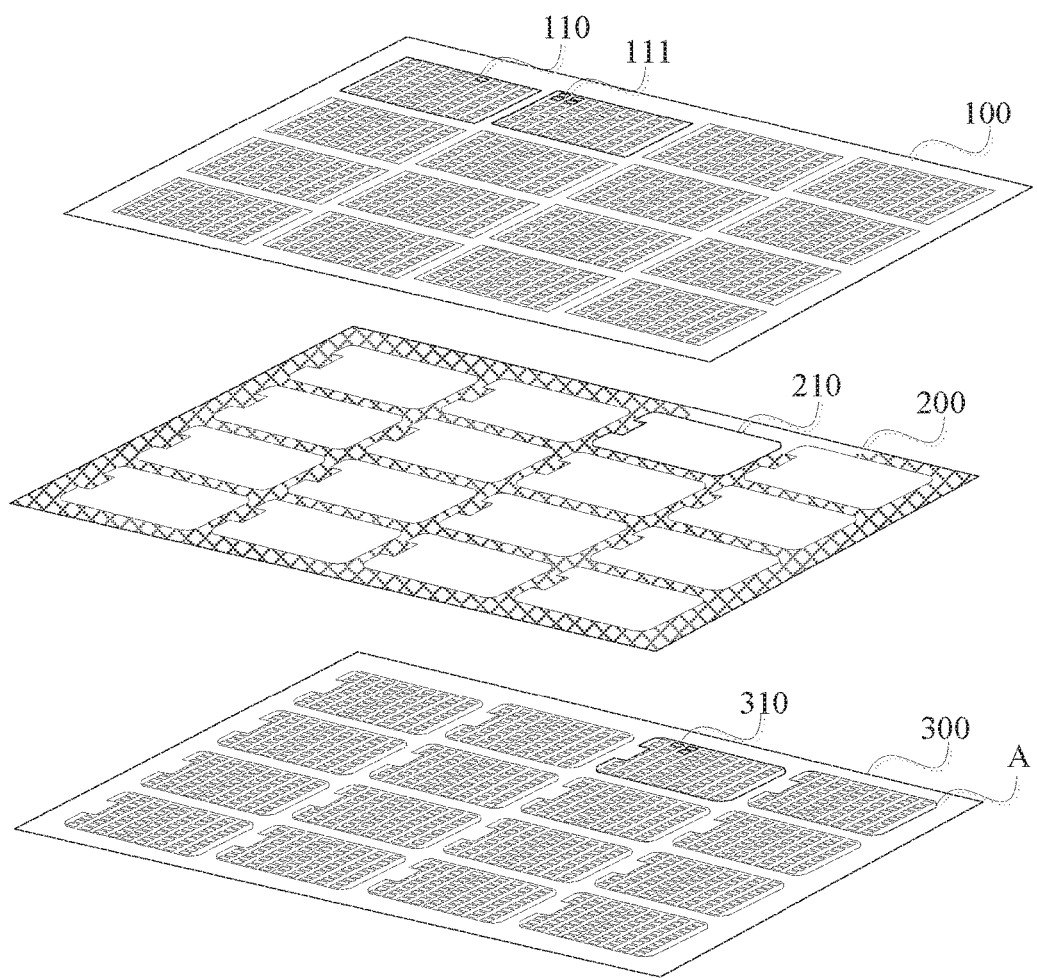
FIG. 3 is a schematic perspective view of a method for manufacturing an organic electroluminescent display panel according to an embodiment of the disclosure.

As illustrated in FIG. 3, organic light-emitting layers 310 of display sub-elements and virtual sub-elements are created on an underlying substrate 300 through evaporation using a fine metal mask 100 and a shielding mask 200 that are arranged in a stack.

Where the shielding mask 200 is located on the side of the fine metal mask 100 facing the underlying substrate 300.

The fine metal mask 100 includes at least one rectangular evaporation area 110 in which there are a plurality of uniformly arranged evaporation patterns 111, and the shielding mask 200 includes at least one non-rectangular shaped opening area 210.

The positive projection of the each rectangular evaporation area 110 onto the shielding mask 200 cover one non-rectangular shaped opening area 210.

In the manufacturing method above according to the embodiment of the disclosure, the organic light-emitting layers 310 in non-rectangular shaped pixel areas A are fabricated using the fine metal mask 100 and the shielding mask 200 that are arranged in a stack, instead of the existing non-rectangular shaped fine metal mask. Where the rectangular evaporation areas 110 of the fine metal mask 100 can be designed to thereby lower the difficulty in the design of mask and evaporation processes of the fine metal mask 100, and improve the precision of design of mask, as compared with the existing non-rectangular shaped evaporation-plating areas 110.

In the manufacturing method according to the embodiment of the disclosure, the shielding mask 200 located on the side of the fine metal mask 100 facing the underlying substrate 300 plays a role of supporting the fine metal mask 100 on one hand, and another role of shielding on the other hand. With the non-rectangular shaped opening areas 210 of the shielding mask 200, the organic light-emitting layers 310 may be fabricated in the non-rectangular shaped pixel areas A, which are in the same shape as the non-rectangular shaped opening areas 210 to thereby accommodate a demand for displaying throughout a screen including the non-rectangular shaped pixel areas A. Furthermore, the shape of the non-rectangular shaped opening areas 210 may be adjusted to thereby adjust the shape of a non-rectangular shaped display area. Stated otherwise, the single versatile fine metal mask 100 and a plurality of shielding masks 200 including different non-rectangular shaped opening areas 210 are used to manufacturer non-rectangular shaped display panels with a plurality of models. There is a lower cost of developing the shielding mask 200 than the fine metal mask 100.

In the organic light-emitting layers 310 fabricated using the manufacturing method above according to the embodiment of the disclosure, as opposed to the prior art in which the edges of the organic light-emitting layers 310 are fabricated using the non-rectangular shaped fine metal mask so that there is a step-like shape of the organic light-emitting layers, the patterns of the organic light-emitting layers 310 fabricated at the edges of the non-rectangular shaped pixel areas A will not be limited due to the distance between the evaporation patterns 111 and the edges of the rectangular evaporation areas 110 in the fine metal mask 100, so that the patterns of the organic light-emitting layers 310 created through evaporation at the edges of the non-rectangular shaped pixel areas A can be relatively smooth, and completely coincide with the edges of the non-rectangular shaped pixel areas A, thus facilitating displaying throughout the screen including the non-rectangular shaped pixel areas A.

Figure 4:
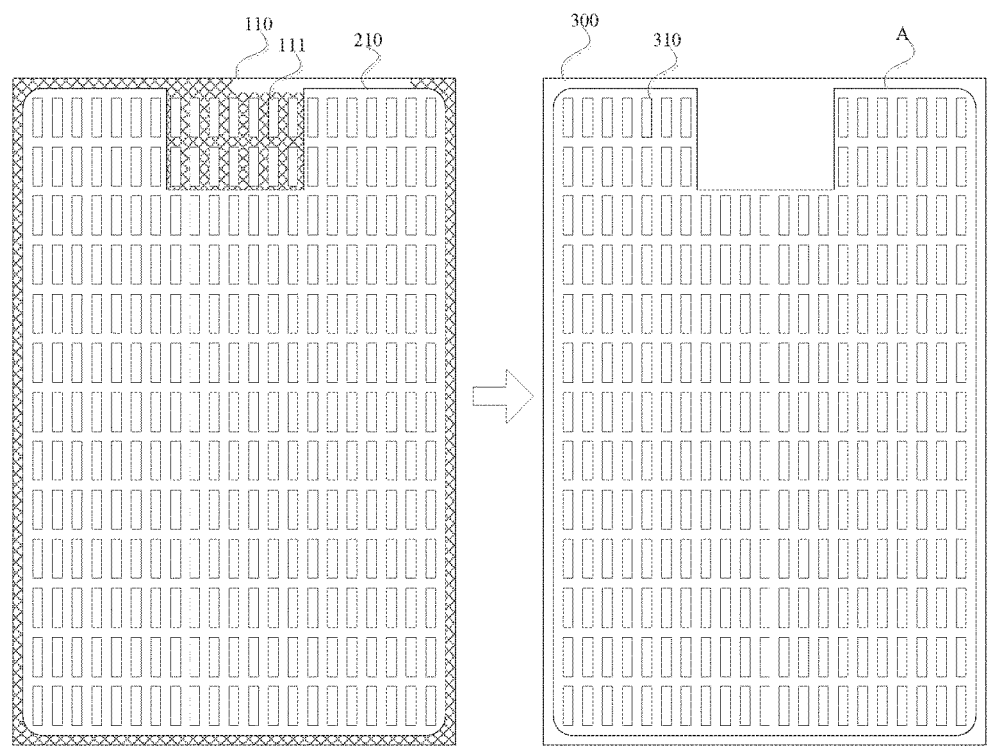
FIG. 4 and FIG. 5 are schematic plan views respectively of the method for manufacturing an organic electroluminescent display panel according to an embodiment of the disclosure.

In one embodiment, in the manufacturing method above according to the embodiment of the disclosure, there may be a plurality of complete evaporation patterns 111 of the respective rectangular evaporation areas 110 in the non-rectangular shaped opening areas 210 as illustrated in FIG. 4.

In one embodiment, FIG. 4 illustrates a structural diagram of a rectangular evaporation area 100 in the shielding mask 200, and a corresponding non-rectangular shaped opening area 210 in the fine metal mask 100 stacked therewith, on the left of the figure. As can be apparent, the edge of the non-rectangular shaped opening area 210 is not covered with any evaporation pattern 111, that is, there are a plurality of complete evaporation patterns 111 both inside and outside the non-rectangular shaped opening area 210. FIG. 4 illustrates a structural diagram of organic light-emitting layers 310 fabricated in a non-rectangular shaped pixel area A of the underlying substrate 300, on the right of the figure, where there is not any incomplete organic light-emitting layer 310 at the edge of the non-rectangular shaped pixel area A. Furthermore, the size and the shape of the non-rectangular shaped opening area 210 can be adjusted so that there is a very short distance between the organic light-emitting layers 310 fabricated at the edge of the non-rectangular shaped pixel area. A of the underlying substrate 300, and the edge of the non-rectangular shaped pixel area A, or they coincide with each other, thus enabling displaying throughout the screen including the non-rectangular shaped pixel area A.

Figure 5:
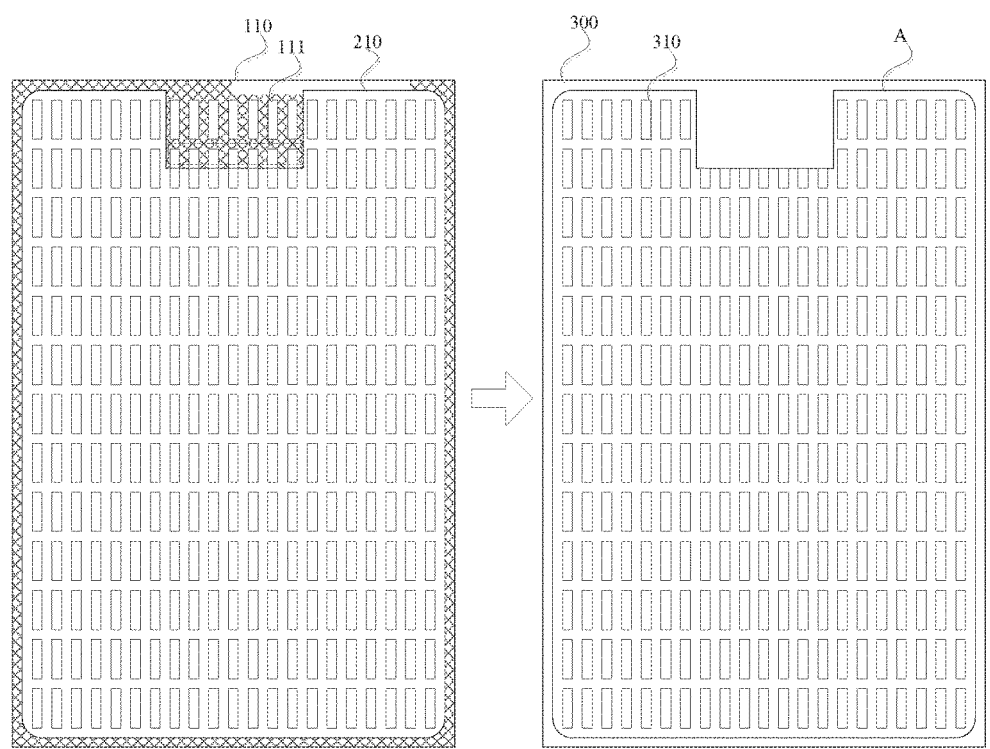

In one embodiment, in the manufacturing method above according to the embodiment of the disclosure, alternatively there may be parts of a plurality of evaporation patterns 111 of respective rectangular evaporation areas 110 on the periphery of the non-rectangular shaped opening area 210 as illustrated in FIG. 5 (denoted in dotted lines in FIG. 5).

In one embodiment, FIG. 5 illustrates a structural diagram of a rectangular evaporation area 100 in the shielding mask 200, and a corresponding non-rectangular shaped opening area 210 in the fine metal mask 100 stacked therewith, on the left of the figure. As can be apparent, there are parts of a plurality of evaporation patterns Ill on the periphery of the non-rectangular shaped opening area 210, so that there are parts of a plurality of evaporation patterns 111 on the periphery of the non-rectangular shaped opening area 210, and there are the other parts of these evaporation patterns 111 inside the non-rectangular shaped opening area 210. FIG. 5 illustrates a structural diagram of organic light-emitting layers 310 fabricated in a non-rectangular shaped pixel area A of the underlying substrate 300, on the right of the figure, where there are organic light-emitting layers 310 with a small area at an edge of the non-rectangular shaped pixel area A. Furthermore, the size and the shape of the non-rectangular shaped opening area 210 can be adjusted so that there is a very short distance between organic light-emitting layers 310 fabricated at another edge of the non-rectangular shaped pixel area A of the underlying substrate 300, and the edge of the non-rectangular shaped pixel area A, or they coincide with each other, thus enabling displaying throughout the screen including the non-rectangular shaped pixel area. A.

In one embodiment, in the manufacturing method above according to the embodiment of the disclosure, the area of the rectangular evaporation area 110 is generally larger than the area of the non-rectangular shaped opening area 210 so that the non-rectangular shaped opening area 210 can shield those parts of the evaporation patterns 111 in the rectangular evaporation area 110, which are outside the non-rectangular shaped pixel area A. In one embodiment, FIG. 4 and FIG. 5 only schematically illustrate the shape and the arrangement pattern of the evaporation patterns 111, but the shape and the arrangement pattern of the evaporation patterns 111 will not be limited thereto in a real application. Furthermore the shape of the non-rectangular shaped opening area 210 will not be limited thereto either in a real application.

Based upon the same inventive idea, an embodiment of the disclosure provides an organic electroluminescent display panel as illustrated in FIG. 6 to FIG. 9, which includes: an underlying substrate 300; and a non-rectangular shaped pixel area A located on the underlying substrate 300, where the non-rectangular shaped pixel area. A includes a display area a1, and a virtual pixel area a2 located on the periphery of the display area a1, where there are display sub-pixels 301 in the display area a1, and virtual sub-pixels 302 in the virtual pixel area a2.

Both the display sub-pixels and the virtual sub-pixels 302 include organic light-emitting layers 310, and while the organic electroluminescent display panel is displaying, the virtual sub-pixels 302 are in a dark state, that is, the virtual sub-pixels 302 do not emit any light.

There is at least one non-rectangular shaped virtual sub-pixel 3022 among the virtual sub-pixels 302, and the area of the organic light-emitting layer 310 in the non-rectangular shaped virtual sub-pixel 3022 is smaller than the area of the organic light-emitting layer 310 in a display sub-pixel 301 capable of emitting light in the same color.

Figure 6:
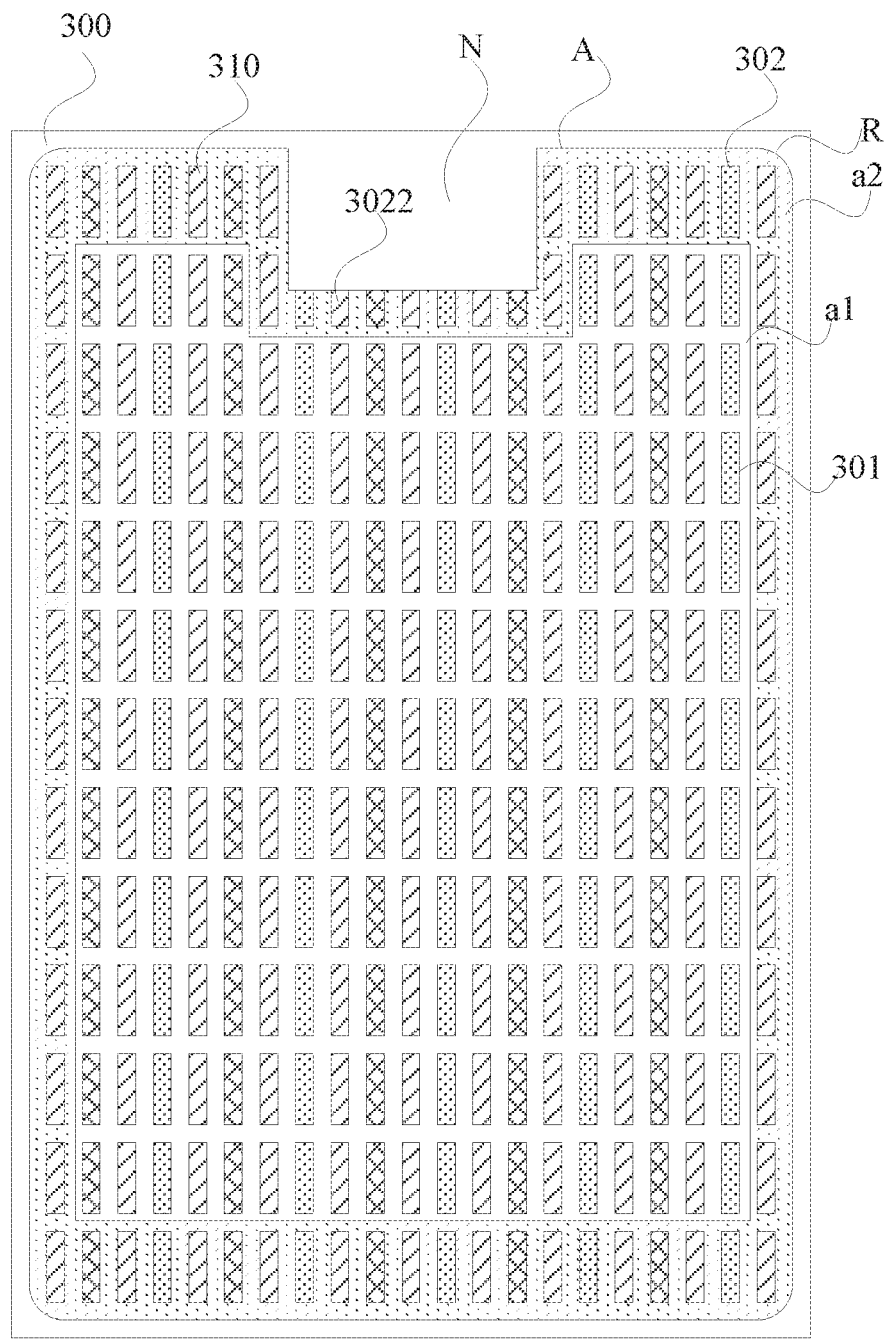
FIG. 6 to FIG. 10 are schematic structural diagrams respectively of an organic electroluminescent display panel according to an embodiment of the disclosure.
Figure 7:
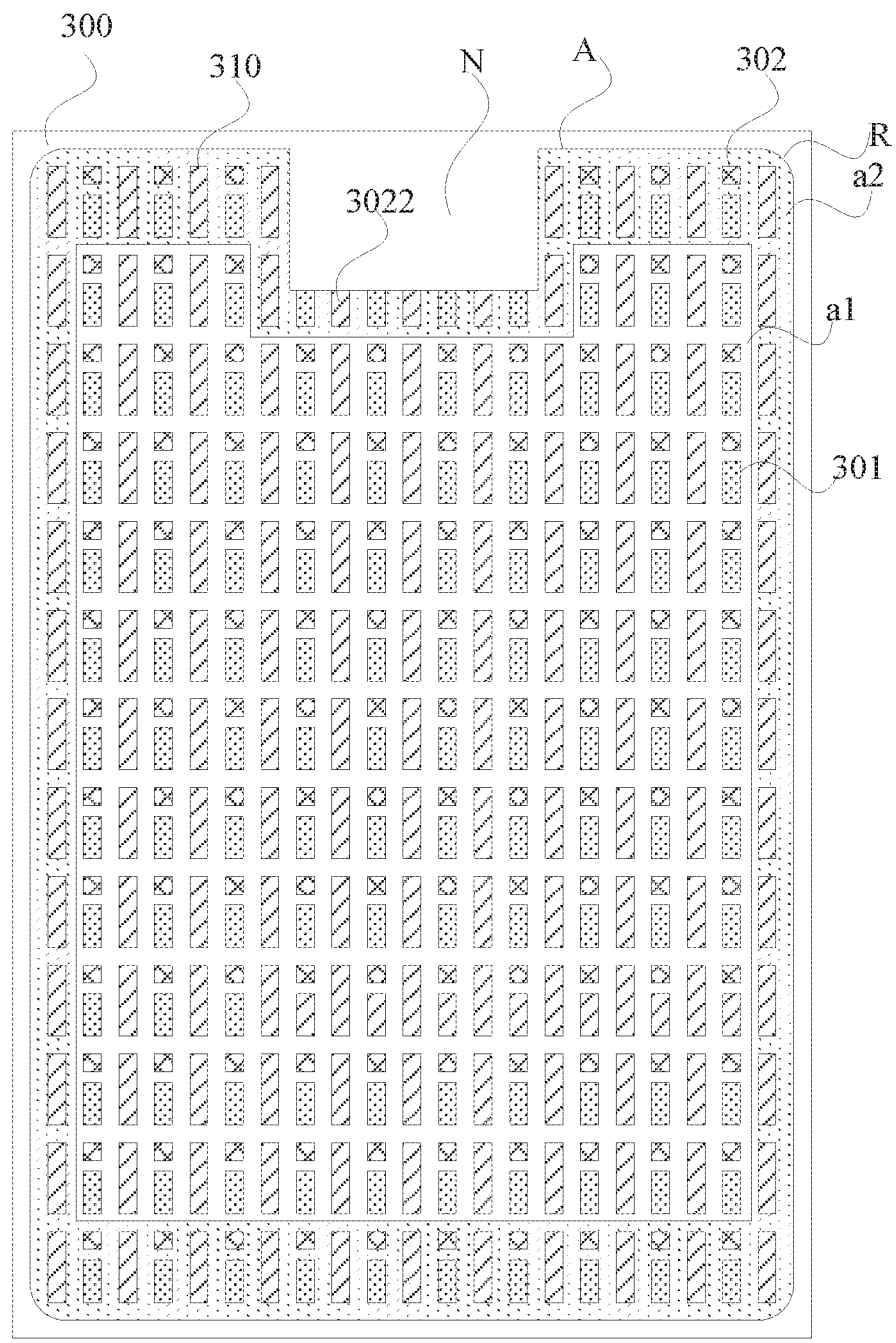
Figure 8:
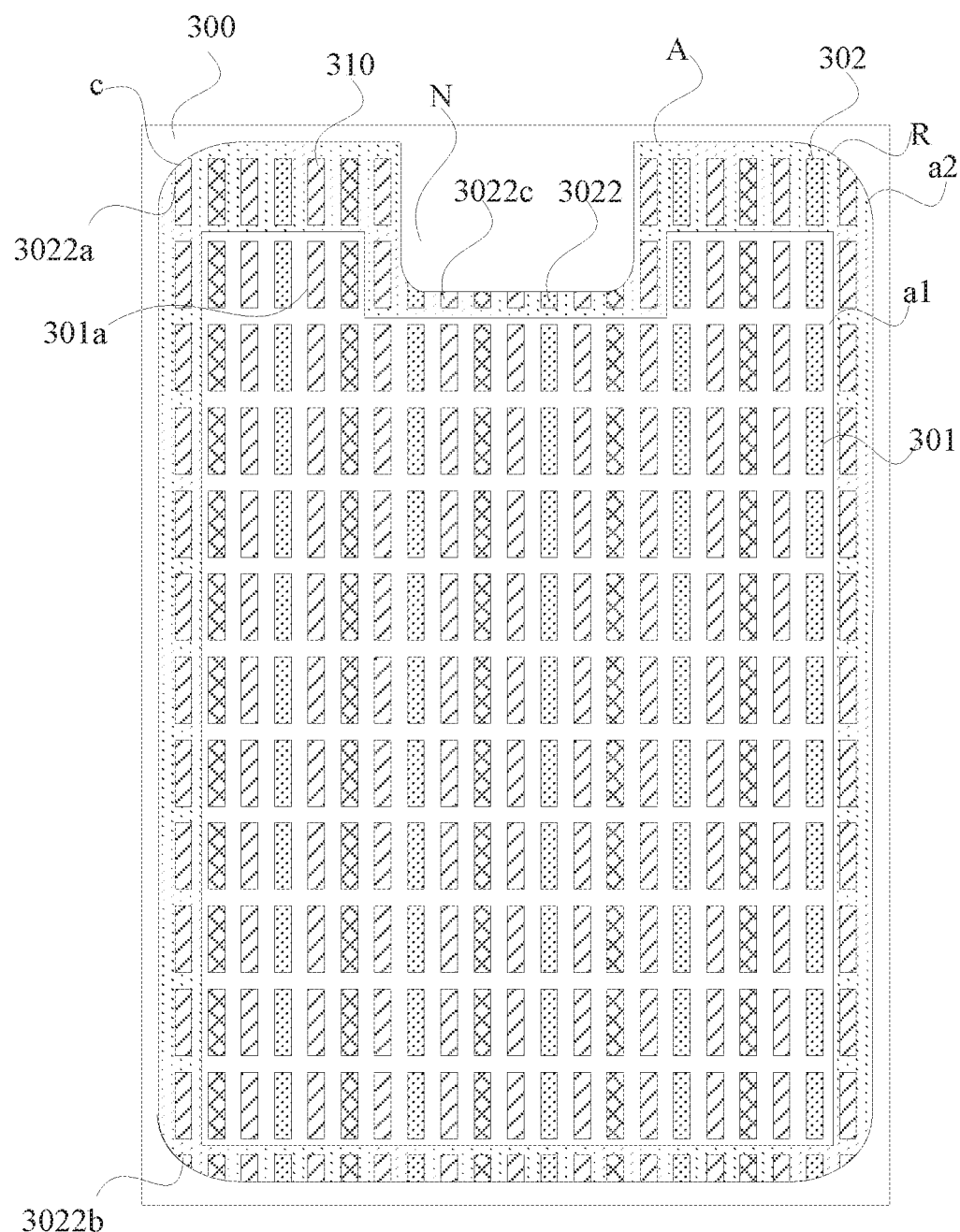
Figure 9:
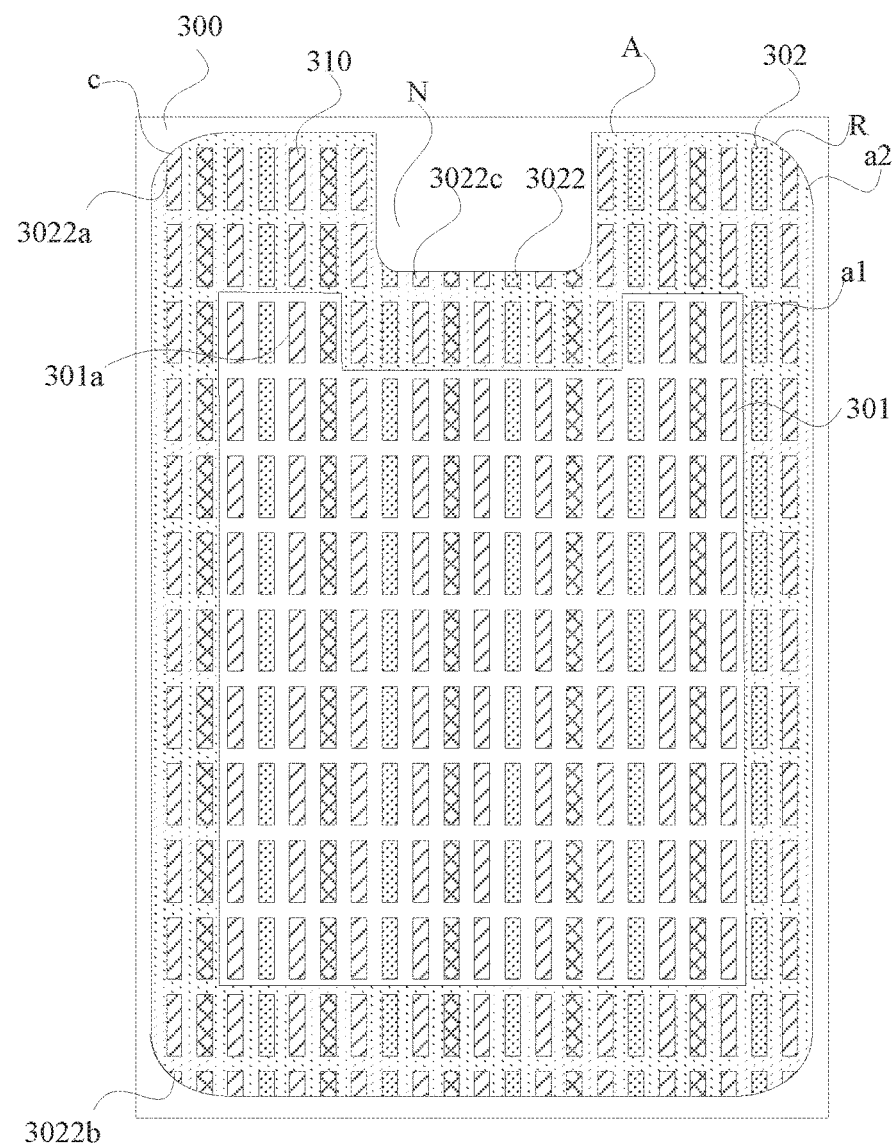

In one embodiment, the display sub-pixels 301 and the virtual sub-pixels 302, which can emit light in the same color are represented as the same filled pattern in FIG. 6 to FIG. 9, that is, the display sub-pixels 301 and the virtual sub-pixels 302, which emit light in the same color are represented as the same filled pattern. It shall be noted that since the virtual sub-pixels 302 do not emit light while the organic electroluminescent display panel is displaying, UV excitation can be used as an excitation mechanism thereof, that is, the virtual sub-pixels 302 can be illuminated with UV rays to emit light in the same color as light emitted by the display sub-pixels 301 being electro-excited. Furthermore for the sake of a convenient illustration, FIG. 6 to FIG. 9 only illustrate schematic shapes of the organic light-emitting layers 310 of the display sub-pixels 301 and the virtual sub-pixels 302, but the shape and the arrangement pattern of the organic light-emitting layers 310 will not be limited thereto in a real application. FIG. 6, FIG. 8, and FIG. 9 illustrate the organic light-emitting layers 310 in the same shape and with the same area, of the respective display sub-pixels 301 and the respective virtual sub-pixels 302, which emit light in different colors, by way of an example, and FIG. 7 illustrates the organic light-emitting layers 310, in the same shape and with different areas, of the respective display sub-pixels 301 and the respective virtual sub-pixels 302, which emit light in different colors, by way of an example; but there may alternatively be the organic light-emitting layers 310, in different shapes, of the respective display sub-pixels 301 and the respective virtual sub-pixels 302, which emit light in different colors, in a real application, so the embodiment of the disclosure will not be limited thereto.

In one embodiment, the organic electroluminescent display panel above according to the embodiment of the disclosure is manufactured using the manufacturing method above, so in the organic electroluminescent display panel above according to the embodiment of the disclosure, the virtual pixel area a2 is arranged on the periphery of the display area a1 in the non-rectangular shaped pixel area A, and the virtual sub-pixels 302 in the virtual pixel area a2 do not emit any light, so the virtual sub-pixels 302 can reserve some additional buffer area for shielding the non-rectangular shaped opening area 210 of the shielding mask 100, that is, there is the non-rectangular shaped virtual sub-pixel 3022 with a smaller area among the virtual sub-pixels 302 in the virtual pixel area a2, and the display sub-pixels 301 remain complete in the display area a1.

In one embodiment, in the organic electroluminescent display panel above according to the embodiment of the disclosure, the non-rectangular shaped virtual sub-pixel 3022 is arranged in the virtual pixel area a2, and as opposed to the prior art in which the edges of the organic light-emitting layers 310 at the edge of the non-rectangular shaped pixel area of the organic electroluminescent display panel are fabricated using the non-rectangular shaped fine metal mask so that there is a step-like shape of the organic light-emitting layers, the patterns of the organic light-emitting layers 310 fabricated at the edge of the non-rectangular shaped pixel area A will not be limited due to the distance between the evaporation patterns 111 and the edge of the rectangular evaporation area 110 in the fine metal mask 100, so that the patterns of the organic light-emitting layers 310 at the edge of the non-rectangular shaped pixel area A can be relatively smooth, and completely coincide with the edge of the non-rectangular shaped pixel area A, thus facilitating displaying throughout the screen including the non-rectangular shaped pixel area A.

In one embodiment, in the organic electroluminescent display panel above according to the embodiment of the disclosure, the area of the organic light-emitting layer 310 in the non-rectangular shaped virtual sub-pixel 3022 may be smaller than the area of the organic light-emitting layer 310 in the display sub-pixel 301 capable of emitting light in the same color in the following specific implementation: the shape of the organic light-emitting layer 310 in the non-rectangular shaped virtual sub-pixel 3022 is different from the shape of the organic light-emitting layer 310 in the display sub-pixel 301 capable of emitting light in the same color, as illustrated in FIG. 8. For example, the shape of the organic light-emitting layer 310 in a non-rectangular shaped virtual sub-pixel 3022*a* at the top-left corner in FIG. 8 is a trapezoid, and the shape of the organic light-emitting layer 310 in a non-rectangular shaped virtual sub-pixel 3022*b* at the bottom-left corner is a triangle, both of which are different from the shape of the light-emitting layer 310 in a display sub-pixel 301*a*. Stated otherwise, the evaporation patterns 111 are segmented at the edge of the non-rectangular shaped opening area 210, so that there are non-rectangular shaped virtual sub-pixels 3022, with their organic light-emitting layers 310 in different shapes, among the fabricated virtual sub-pixels 302. Of course, alternatively a non-rectangular shaped virtual sub-pixel 3022 may be fabricated with its organic light-emitting layer 310 in a similar shape to the virtual sub-pixels 302, and for example, the shape of the organic light-emitting layer 310 of a non-rectangular shaped virtual sub-pixel 3022*c* in FIG. 8 is a rectangle similar in shape to the organic light-emitting layers 310 of the virtual sub-pixels 302.

In one embodiment, in the organic electroluminescent display panel above according to the embodiment of the disclosure, as illustrated in FIG. 8, the number of sides of the organic light-emitting layer 310 of at least one non-rectangular shaped virtual sub-pixel 3022a may be larger than the number of sides of the organic light-emitting layer 310 of the display sub-pixel 301a capable of emitting light in the same color; or the number of sides of the organic light-emitting layer 310 of at least one non-rectangular shaped virtual sub-pixel 3022b may be larger than the number of sides of the organic light-emitting layer 310 of the display sub-pixel 301a capable of emitting light in the same color. For example, the organic light-emitting layer 310 of the non-rectangular shaped virtual sub-pixel 3022a at the top-left corner in FIG. 8 has five sides, and a shape similar to a trapezoid, and the organic light-emitting layer 310 of the non-rectangular shaped virtual sub-pixel 3022b at the bottom-left corner has three sides, and a shape similar to a triangle, where their sides are more or less than four sides of the organic light-emitting layer 310 of the display sub-pixel 301a. Stated otherwise, the evaporation patterns 111 are segmented at the edge of the non-rectangular shaped opening area 210, so that there are non-rectangular shaped virtual sub-pixels 3022, with their organic light-emitting layers 310 including different numbers of sides, among the fabricated virtual sub-pixels 302. Of course, alternatively a non-rectangular shaped virtual sub-pixel 3022 may be fabricated with its organic light-emitting layer 310 including the same number of sides as the virtual sub-pixels 302, and for example, the organic light-emitting layer 310 of the non-rectangular shaped virtual sub-pixel 3022c in FIG. 8 has the same number of four sides as the number of four sides the organic light-emitting layers 310 of the virtual sub-pixels 302.

In one embodiment, in the organic electroluminescent display panel above according to the embodiment of the disclosure, the organic light-emitting layer 310 of at least one non-rectangular shaped virtual sub-pixel 3022 may include an arc-shaped side c as illustrated in FIG. 8. For example, there is an arc-shaped side c of the organic light-emitting layer 310 of the non-rectangular shaped virtual sub-pixel 3022a at the top-left corner in FIG. 8. Stated otherwise, the evaporation patterns 111 are segmented in the non-rectangular shaped opening area 210 according to a varying shape of the edge of the non-rectangular shaped opening area 210, so that there is a non-rectangular shaped virtual sub-pixel 3022, with its organic light-emitting layer 310 including an arc-shaped side c, among the fabricated virtual sub-pixels 302.

In one embodiment, in the organic electroluminescent display panel above according to the embodiment of the disclosure, the area of the organic light-emitting layer 310 of at least one non-rectangular shaped virtual sub-pixel 3022 is smaller than a half of the area of the organic light-emitting layer 310 of the display sub-pixel 301 capable of emitting light in the same color, as illustrated in FIG. 8. For example, the area of the organic light-emitting layer 310 of the non-rectangular shaped virtual sub-pixel 3022b at the bottom-left in FIG. 8 is smaller than a half of the area of the organic light-emitting layer 310 of the display sub-pixel 301.

In one embodiment, in the organic electroluminescent display panel above according to the embodiment of the disclosure, the area of the organic light-emitting layer 310 of at least one non-rectangular shaped virtual sub-pixel 3022 is larger than a half of the area of the organic light-emitting layer 310 of the display sub-pixel 301 capable of emitting light in the same color, as illustrated in FIG. 8. For example, the area of the organic light-emitting layer 310 of the non-rectangular shaped virtual sub-pixel 3022a at the top-left in FIG. 8 is larger than a half of the area of the organic light-emitting layer 310 of the display sub-pixel 301.

In one embodiment, in the organic electroluminescent display panel above according to the embodiment of the disclosure, there may be both such a case that the area of the organic light-emitting layer 310 of at least one non-rectangular shaped virtual sub-pixel 3022 is larger than a half of the area of the organic light-emitting layer 310 of the display sub-pixel 301 capable of emitting light in the same color, and such a case that the area of the organic light-emitting layer 310 of at least one non-rectangular shaped virtual sub-pixel 3022 is smaller than a half of the area of the organic light-emitting layer 310 of the display sub-pixel 301 capable of emitting light in the same color, as illustrated in FIG. 8. As illustrated in FIG. 6 and FIG. 7, there may be such a case that the area of the organic light-emitting layer 310 of at least one non-rectangular shaped virtual sub-pixel 3022 is larger than a half of the area of the organic light-emitting layer 310 of the display sub-pixel 301 capable of emitting light in the same color, or such a case that the area of the organic light-emitting layer 310 of at least one non-rectangular shaped virtual sub-pixel 3022 is smaller than a half of the area of the organic light-emitting layer 310 of the display sub-pixel 301 capable of emitting light in the same color.

Figure 10:
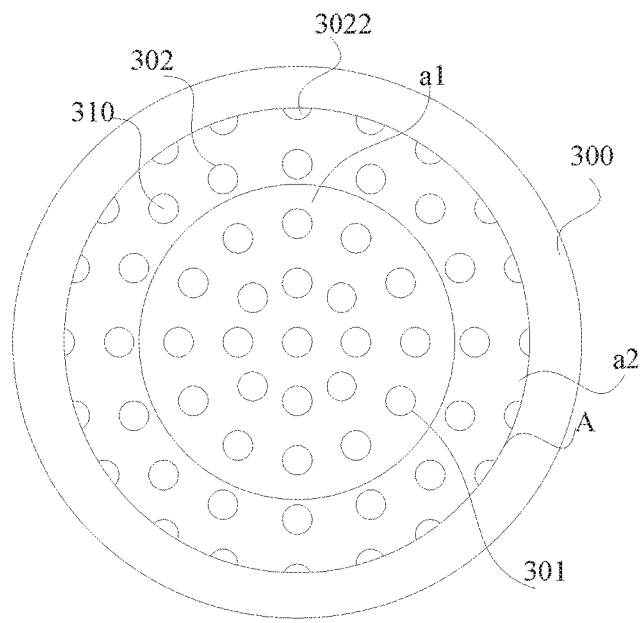

In one embodiment, in the organic electroluminescent display panel above according to the embodiment of the disclosure, as illustrated in FIG. 6 to FIG. 10, the non-rectangular shaped virtual sub-pixels 3022 are arranged on the periphery of the virtual pixel area a2, that is, the non-rectangular shaped virtual sub-pixels 3022 are at the outermost edge of the virtual pixel area a2, thus displaying throughout the screen including the non-rectangular shaped display area A as much as possible. In one embodiment, as illustrated in FIG. 6 to FIG. 9, the non-rectangular shaped virtual sub-pixels 3022 may be arranged at a part of the edge of the virtual pixel area a2, and for example, they are arranged at the arc-shaped edge and the notch of the virtual pixel area a2; or the non-rectangular shaped virtual sub-pixels 3022 may be arranged throughout the edge of the virtual pixel area a2 as illustrated in FIG. 10, although the embodiment of the disclosure will not be limited thereto.

In one embodiment, in the organic electroluminescent display panel above according to the embodiment of the disclosure, there may be n rows of virtual sub-pixels 302 in the virtual pixel area a2 in the direction from the display area a1 to the virtual pixel area a2 as illustrated in FIG. 6 to FIG. 10, where n is more than or equal to 1. In one embodiment, there is at least one row of virtual sub-pixels 302 between the outermost display sub-pixels 301 in the display area a1, and the outermost edge of the non-rectangular shaped pixel area A, and the virtual sub-pixels 302 can reserve some additional buffer area for shielding the non-rectangular shaped opening area 210 of the shielding mask 200, that is, there are the non-rectangular shaped virtual sub-pixels 3022 with a smaller area among the virtual sub-pixels 302 in the virtual pixel area a2, and the display sub-pixels 301 remain complete in the display area a1.

In one embodiment, in the organic electroluminescent display panel above according to the embodiment of the disclosure, the number of rows of virtual sub-pixels 302 in the virtual pixel area a2 is generally more than or equal to 2, and less than or equal to 5 as illustrated in FIG. 9 and FIG. 10. FIG. 9 and FIG. 10 illustrates two rows of virtual sub-pixels 302. In one embodiment, when at least three rows of virtual sub-pixels 302 in the virtual pixel area a2 are arranged, there may be a better buffering effect so that there are non-rectangular shaped virtual sub-pixels 3022 with a smaller area among the virtual sub-pixels 302 in the virtual pixel area a2, and the display sub-pixels 301 remain complete in the display area a1.

In one embodiment, in the organic electroluminescent display panel above according to the embodiment of the disclosure, there are equal areas of the organic light-emitting layers 310 of the display sub-pixels 301 capable of emitting in the same color in the display area a1 as illustrated in FIG. 6 to FIG. 9. Stated otherwise, there are equal areas of the organic light-emitting layers 310 of the display sub-pixels 301 emitting in the same color in the display area a1 so that there is a uniform color of light emitted in the display area a1.

In one embodiment, in the organic electroluminescent display panel above according to the embodiment of the disclosure, there are different areas of the organic light-emitting layers 310 of at least two of the non-rectangular shaped virtual sub-pixels 3022 capable of emitting light in the same color as illustrated in FIG. 8 and FIG. 9. For example, there are different areas of the organic light-emitting layers 310 of the non-rectangular shaped virtual sub-pixels 3022a, 3022b, and 3022c in FIG. 8 and FIG. 9 to thereby accommodate the shape of the edge of the non-rectangular shaped pixel area.

In one embodiment, in the organic electroluminescent display panel above according to the embodiment of the disclosure, there are different shapes of the organic light-emitting layers 310 of at least two of the non-rectangular shaped virtual sub-pixels 3022 capable of emitting light in the same color in the virtual pixel area a2 as illustrated in FIG. 8 and FIG. 9. For example, there are different shapes of the organic light-emitting layers 310 of the non-rectangular shaped virtual sub-pixels 3022a, 3022b, and 3022c in FIG. 8 and FIG. 9 to thereby accommodate the shape of the edge of the non-rectangular shaped pixel area.

Figure 11:
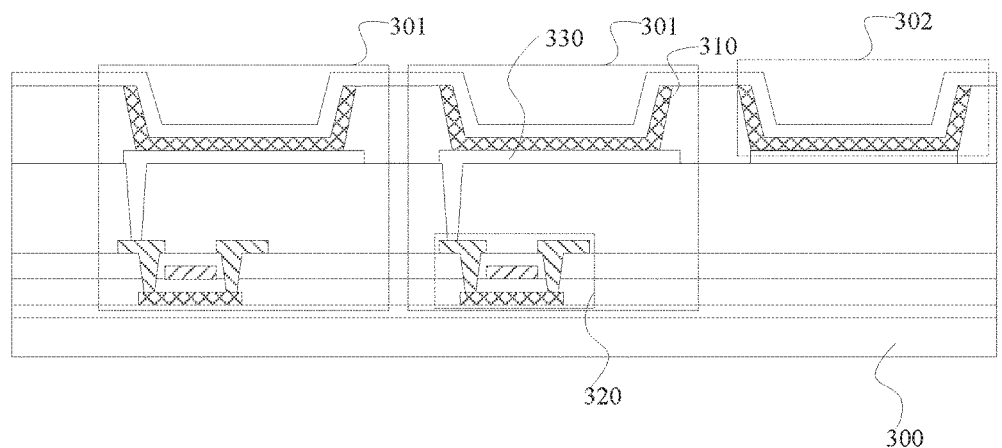
FIG. 11 and FIG. 12 are schematic structural diagrams respectively of the organic electroluminescent display panel according to an embodiment of the disclosure in partial side views.

In one embodiment, in the organic electroluminescent display panel above according to the embodiment of the disclosure, the display sub-pixel 301 includes a pixel circuit 320 located between the organic light-emitting layer 310 and the underlying substrate 300 as illustrated in FIG. 11. In one embodiment, the pixel circuit 320 is arranged in the display area a1, that is, the pixel circuit 320 is not arranged in the virtual pixel area a2, so that while the organic electroluminescent display panel is displaying, the display sub-pixel 301 is in a bright state, and the virtual sub-pixel 302 is in a dark state, that is, light is emitted in the display area a1, and no light is emitted in the virtual pixel area a2.

Figure 12:
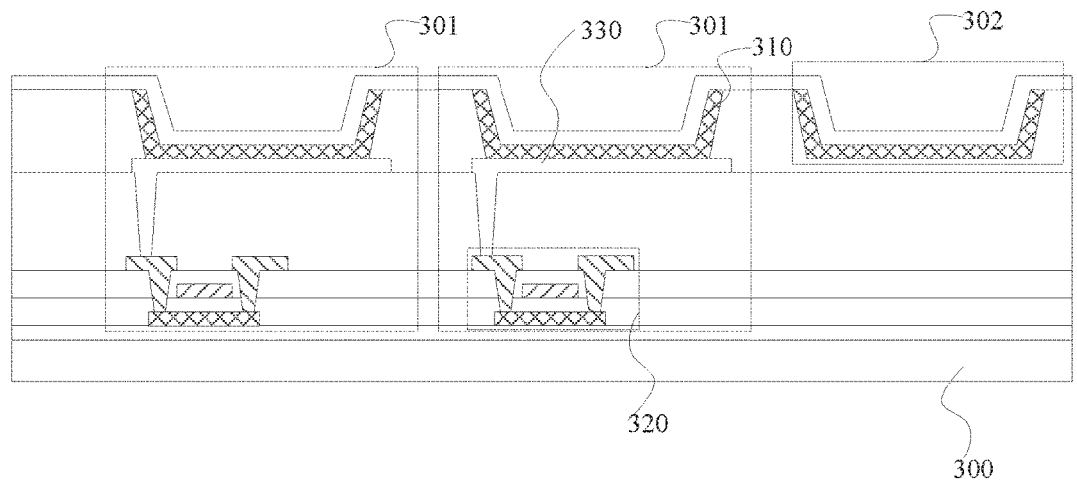

In one embodiment, in the organic electroluminescent display panel above according to the embodiment of the disclosure, the display sub-pixel 301 includes an anode 330 located between the organic light-emitting layer 310 and the underlying substrate 300 as illustrated in FIG. 12.

In one embodiment, the anode 330 is arranged in the display area a1, that is, the anode 330 is not arranged in the virtual pixel area a2, so that while the organic electroluminescent display panel is displaying, the display sub-pixel 301 is in a bright state, and the virtual sub-pixel 302 is in a dark state, that is, light is emitted in the display area a1, and no light is emitted in the virtual pixel area a2.

In one embodiment, in the organic electroluminescent display panel above according to the embodiment of the disclosure, the display sub-pixel 301 may include a pixel circuit 320 located between the organic light-emitting layer 310 and the underlying substrate 300, and also the display sub-pixel 301 may include an anode 330 located between the organic light-emitting layer 310 and the underlying substrate 300, as illustrated in FIG. 12. As illustrated in FIG. 11, the display sub-pixel 301 may include a pixel circuit 320 located between the organic light-emitting layer 310 and the underlying substrate 300, and also both the display sub-pixel 301 and the virtual sub-pixel 302 may include an anode 330 located between the organic light-emitting layer 310 and the underlying substrate 300; or both the display sub-pixel 301 and the virtual sub-pixel 302 may include a pixel circuit 320 located between the organic light-emitting layer 310 and the underlying substrate 300, and also the display sub-pixel 301 may include an anode 330 located between the organic light-emitting layer 310 and the underlying substrate 300, although the embodiment of the disclosure will not be limited thereto.

In one embodiment, in the organic electroluminescent display panel above according to the embodiment of the disclosure, the display sub-pixels 301 and the virtual sub-pixels 302 may be arranged uniformly in an array, that is, the display sub-pixels 301 and the virtual sub-pixels 302 are aligned and arranged in both the row direction and the column direction, as illustrated in FIG. 6 to FIG. 9.

In one embodiment, in the organic electroluminescent display panel above according to the embodiment of the disclosure, the display sub-pixels 301 and the virtual sub-pixels 302 may be arranged uniformly in a circle, that is, the display sub-pixels 301 and the virtual sub-pixels 302 are divergent from a center, as illustrated in FIG. 10.

In one embodiment, in the organic electroluminescent display panel above according to the embodiment of the disclosure, there is at least one non-right-angle corner R of the non-rectangular shaped pixel area. A as illustrated in FIG. 6 to FIG. 9. FIG. 6 to FIG. 9 illustrate the non-rectangular shaped pixel area A with four arc corners. There may be one or two arc corners of the non-rectangular shaped pixel area A in a real application, although the embodiment of the disclosure will not be limited thereto.

In one embodiment, in the organic electroluminescent display panel above according to the embodiment of the disclosure, there is a notch N on at least one side of the non-rectangular shaped pixel area. A. FIG. 6 to FIG. 9 illustrate the non-rectangular shaped pixel area. A with a notch N on the upper side thereof. There may alternatively be a notch N on the lower side of the non-rectangular shaped pixel area A in a real application, although the embodiment of the disclosure will not be limited thereto.

In one embodiment, in the organic electroluminescent display panel above according to the embodiment of the disclosure, a part of the contour of the edge of the notch N may be an arc as illustrated in FIG. 8 and FIG. 9 to thereby accommodate a non-right-angle corner R of the non-rectangular shaped pixel area A, thus providing the display panel with sonic arc.

Figure 13:
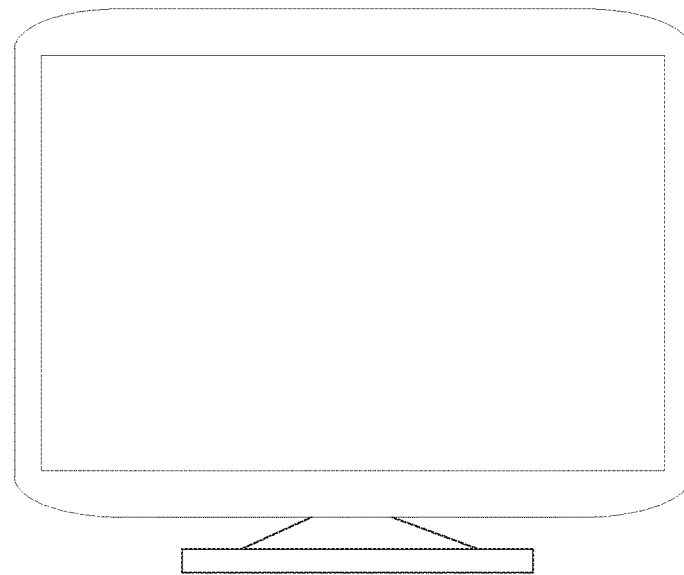
FIG. 13 is a schematic structural diagram of a display panel according to an embodiment of the disclosure.

Based upon the same inventive idea, an embodiment of the disclosure further provides a display device as illustrated in FIG. 13, which includes the organic electroluminescent display panel above according to the embodiment of the disclosure. The display device may be a mobile phone, a tablet computer, a TV set, a monitor, a notebook computer, a digital photo frame, a navigator, or any other product or component with a display function. Reference can be made to the embodiment of the organic electroluminescent display panel above for an implementation of the display device, so a repeated description thereof will be omitted here.

In the organic electroluminescent display panel, the method for manufacturing the same, and the display device above according to the embodiments of the disclosure, the organic light-emitting layers of the display sub-pixels and the virtual sub-pixels can be created on the underlying substrate through evaporation using the fine metal mask and the shielding mask arranged in a stack, and the area of the organic light-emitting layer of the non-rectangular shaped virtual sub-pixel among the virtual sub-pixels is smaller than the area of the organic light-emitting layer of the display sub-pixel capable of emitting light in the same color. Where the fine metal mask includes at least one rectangular evaporation area in which there are a plurality of uniformly arranged evaporation patterns, and the rectangular evaporation areas can be designed to thereby lower the difficulty in the design of mask and evaporation processes of the fine metal mask; and the shielding mask is located on the side of the fine metal mask facing the underlying substrate, the shielding mask includes at least one non-rectangular shaped opening area, and positive projections of the respective rectangular evaporation areas onto the shielding mask cover the respective non-rectangular shaped opening areas respectively, so that the patterns of the organic light-emitting layers created through evaporation at the edges of the non-rectangular shaped pixel areas can completely coincide with the edges of the non-rectangular shaped pixel areas, thus facilitating displaying throughout the screen including the non-rectangular shaped pixel areas.

The invention claimed is:

1. An organic electroluminescent display panel, comprising:
   an underlying substrate; and
   a non-rectangular shaped pixel area located on the underlying substrate, the non-rectangular shaped pixel area comprising a display area, and a virtual pixel area located on a periphery of the display area, wherein the display area comprises display sub-pixels, and the virtual pixel area comprises virtual sub-pixels, wherein:
   both the display sub-pixels and the virtual sub-pixels comprise organic light-emitting layers, and while the organic electroluminescent display panel is displaying, the virtual sub-pixels are in a dark state; and
   there is at least one non-rectangular shaped virtual sub-pixel among the virtual sub-pixels, and an area of the organic light-emitting layer in the non-rectangular shaped virtual sub-pixel is smaller than an area of the organic light-emitting layer in a display sub-pixel capable of emitting light in a same color.

2. The organic electroluminescent display panel according to claim 1, wherein a shape of the organic light-emitting layer in the non-rectangular shaped virtual sub-pixel is different from a shape of the organic light-emitting layer in the display sub-pixel capable of emitting light in the same color.

3. The organic electroluminescent display panel according to claim 2, wherein the number of sides of the organic light-emitting layer of the at least one non-rectangular shaped virtual sub-pixel is more than or less than the number of sides of the organic light-emitting layer of the display sub-pixel capable of emitting light in the same color.

4. The organic electroluminescent display panel according to claim 1, wherein the organic light-emitting layer of the at least one non-rectangular shaped virtual sub-pixel comprises an arc-shaped side.

5. The organic electroluminescent display panel according to claim 1, wherein the area of the organic light-emitting layer of the at least one non-rectangular shaped virtual sub-pixel is smaller than a half of the area of the organic light-emitting layer of the display sub-pixel capable of emitting light in the same color.

6. The organic electroluminescent display panel according to claim 1, wherein the area of the organic light-emitting layer of the at least one non-rectangular shaped virtual sub-pixel is larger than a half of the area of the organic light-emitting layer of the display sub-pixel capable of emitting light in the same color.

7. The organic electroluminescent display panel according to claim 1, wherein the non-rectangular shaped virtual sub-pixel is arranged on a periphery of the virtual pixel area.

8. The organic electroluminescent display panel according to claim 1, wherein there are n rows of virtual sub-pixels in the virtual pixel area in a direction from the display area to the virtual pixel area, wherein n is more than or equal to 1.

9. The organic electroluminescent display panel according to claim 8, wherein the number of rows of virtual sub-pixels in the virtual pixel area is more than or equal to 2, and less than or equal to 5.

10. The organic electroluminescent display panel according to claim 1, wherein there are equal areas of the organic light-emitting layers of the display sub-pixels capable of emitting in a same color in the display area.

11. The organic electroluminescent display panel according to claim 1, wherein there are different areas of the organic light-emitting layers of at least two of the non-rectangular shaped virtual sub-pixels capable of emitting light in a same color in the virtual pixel area.

12. The organic electroluminescent display panel according to claim 1, wherein there are different shapes of the organic light-emitting layers of at least two of the non-rectangular shaped virtual sub-pixels capable of emitting light in a same color in the virtual pixel area.

13. The organic electroluminescent display panel according to claim 1, wherein the display sub-pixels comprise pixel circuits located between the organic light-emitting layers and the underlying substrate.

14. The organic electroluminescent display panel according to claim 1, wherein the display sub-pixels comprise anodes located between the organic light-emitting layers and the underlying substrate.

15. The organic electroluminescent display passel according to claim 1, wherein the display sub-pixels and the virtual sub-pixels are arranged uniformly in an array.

16. The organic electroluminescent display panel according to claim 1, wherein the display sub-pixels and the virtual sub-pixels are arranged uniformly in a circle.

17. The organic electroluminescent display panel according to claim 1, wherein there is at least one non-right-angle corner in the non-rectangular shaped pixel area.

18. The organic electroluminescent display panel according to claim 1, wherein there is a notch on at least one side of the non-rectangular shaped pixel area.

19. The organic electroluminescent display panel according to claim 18, wherein a part of contour of an edge of the notch is an arc.

20. A display device, comprising an organic electroluminescent display panel, wherein the organic electroluminescent display panel comprises:
   an underlying substrate; and
   a non-rectangular shaped pixel area located on the underlying substrate, the non-rectangular shaped pixel area comprising a display area, and a virtual pixel area located on a periphery of the display area, wherein the display area comprises display sub-pixels, and the virtual pixel area comprises virtual sub-pixels, wherein:
   both the display sub-pixels and the virtual sub-pixels comprise organic light-emitting layers, and while the organic electroluminescent display panel is displaying, the virtual sub-pixels are in a dark state; and there is at least one non-rectangular shaped virtual sub-pixel among the virtual sub-pixels, and an area of the organic light-emitting layer in the non-rectangular shaped virtual sub-pixel is smaller than an area of the organic light-emitting layer in a display sub-pixel capable of emitting light in a same color.

21. A method for manufacturing an organic electroluminescent display panel, the method comprising:
creating organic light-emitting layers of display sub-elements and virtual sub-elements on an underlying substrate through evaporation using a fine metal mask and a shielding mask arranged in a stack, wherein:
the shielding mask is located on a side of the fine metal ask facing the underlying substrate; and
the fine metal mask comprises at least one rectangular evaporation area in which there are a plurality of uniformly arranged evaporation patterns, and the shielding mask comprises at least one non-rectangular shaped opening area, wherein:
a positive projection of each rectangular evaporation area onto the shielding mask cover one non-rectangular shaped opening area.

22. The manufacturing method according to claim 21, wherein there are a plurality of complete evaporation patterns of the respective rectangular evaporation areas in the non-rectangular shaped opening areas.

23. The manufacturing method according to claim 21, wherein there are parts of the evaporation patterns in the respective rectangular evaporation areas on the peripheries of the non-rectangular shaped opening areas.

24. The manufacturing method according to claim 21, wherein areas of the rectangular evaporation areas are larger than areas of the non-rectangular shaped opening areas.

* * * * *